United States Patent
Arai et al.

(10) Patent No.: US 7,541,654 B2
(45) Date of Patent: Jun. 2, 2009

(54) SEMICONDUCTOR MEMORY DEVICE AND SEMICONDUCTOR DEVICE INCLUDING MULTILAYER GATE ELECTRODE

(75) Inventors: Fumitaka Arai, Yokohama (JP); Makoto Sakuma, Kuwana (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 76 days.

(21) Appl. No.: 11/565,843

(22) Filed: Dec. 1, 2006

(65) Prior Publication Data
US 2007/0138575 A1 Jun. 21, 2007

(30) Foreign Application Priority Data
Dec. 21, 2005 (JP) ............... 2005-368148

(51) Int. Cl.
*H01L 27/115* (2006.01)
(52) U.S. Cl. .............. 257/390; 257/E21.662; 257/E21.68
(58) Field of Classification Search ......... 257/390, 257/E21.68
See application file for complete search history.

(56) References Cited

U.S. PATENT DOCUMENTS

| 5,637,895 | A * | 6/1997 | Iwata et al. ............. 257/315 |
| 7,078,813 | B2 | 7/2006 | Sakuma et al. |
| 2002/0036317 | A1* | 3/2002 | Matsui et al. ............ 257/315 |
| 2005/0073001 | A1 | 4/2005 | Kamigaichi et al. |
| 2006/0018181 | A1 | 1/2006 | Matsunaga et al. |
| 2006/0237767 | A1 | 10/2006 | Sakuma et al. |
| 2006/0244013 | A1 | 11/2006 | Matsunaga et al. |
| 2007/0138575 | A1 | 6/2007 | Arai et al. |

FOREIGN PATENT DOCUMENTS

JP 2000-91546 3/2000

OTHER PUBLICATIONS

U.S. Appl. No. 11/450,355, filed Jul. 12, 2006, Hiroyuki Kutsukake, et al.
U.S. Appl. No. 11/980,561, filed Oct. 31, 2007, Sakuma, et al.
U.S. Appl. No. 12/143,597, filed Jun. 20, 2008, Sakuma, et al.

* cited by examiner

*Primary Examiner*—Sue A. Purvis
*Assistant Examiner*—W. Wendy Kuo
(74) *Attorney, Agent, or Firm*—Oblon, Spivak, McClelland, Maier & Neustadt, P.C.

(57) ABSTRACT

In a memory cell array are arranged a plurality of cell units having memory cells and selection gate transistors to select the memory cell. A first selection gate line includes a control gate of the selection gate transistors. A second selection gate line is formed above the first selection gate line. The first selection gate line has a first gate electrode, a first inter-gate insulating film and a second gate electrode superimposed in this order. The first inter-gate insulating film has a first opening portion through which the first gate electrode and the second gate electrode come into contact with each other. A contact material is formed on the first selection gate line, and electrically connects the first selection gate line and the second selection gate line with each other. The contact material is arranged on the first selection gate line on which the first opening portion is not arranged.

7 Claims, 4 Drawing Sheets

SEMICONDUCTOR MEMORY DEVICE AND SEMICONDUCTOR DEVICE INCLUDING MULTILAYER GATE ELECTRODE

CROSS-REFERENCE TO RELATED APPLICATIONS

This application is based upon and claims the benefit of priority from prior Japanese Patent Application No. 2005-368148, filed Dec. 21, 2005, the entire contents of which are incorporated herein by reference.

BACKGROUND OF THE INVENTION

1. Field of the Invention

The present invention relates to a semiconductor memory device or a semiconductor device, and relates to, e.g., an electrically rewritable NAND type EEPROM (an electrically erasable and programmable ROM) including memory cells each having a control gate and a floating gate.

2. Description of the Related Art

In recent years, as an electrically rewritable non-volatile semiconductor memory device, an NAND type EEPROM is used in various kinds of devices. The NAND type EEPROM has a plurality of NAND type memory cells connected in series (which will be referred to as NAND cells hereinafter) and selection gate transistors arranged at both ends of each NAND cell. The selection gate transistors are positioned at both ends of each NAND cell. When the selection gate transistor alone connected with the NAND cell at a selected address is turned on, selection/non-selection of the NAND cell is defined.

A high-voltage pulse at the time of a write operation or a high-speed pulse at the time of a read operation is applied to a word line adjacent to a gate electrode (which will be referred to as a selection gate hereinafter) of the selection gate transistor. In such a case, when a selection gate potential of the selection gate transistor is affected to fluctuate, characteristics of the above-described selection/non-selection are deteriorated. Therefore, the selection gate of the selection gate transistor is backed (shunted) by a metal wiring line having a lower resistance in a cell array (see, e.g., Jpn. Pat. Appln. KOKAI Publication No. 2000-91546). Since the metal wiring line is formed in an upper late of the selection gate, a contact material which connects the metal wiring line with the selection gate is required. A region in which the contact material which connects the metal wiring line with the selection gate is formed in order to reduce a resistance of the selection gate in this manner will be referred to as a shun region hereinafter.

In case of forming the contact material on the selection gate in the shunt region, there is concern that a gate insulating film immediately below the contact material is damaged due to a mechanical stress during processing or a stress due to boring a gate material, and there occurs a problem that noise of a selection gate potential is thereby increased.

Further, in a transistor constituting a peripheral circuit, there is likewise concern that a gate insulating film immediately below a contact material is damaged when forming the contact material on a gate electrode, and hence a gate electrode region in which the contact material is arranged is required on an element isolation region. Therefore, there occurs a problem that an area required for formation of the transistor cannot be reduced.

BRIEF SUMMARY OF THE INVENTION

According to a first aspect of the present invention, there is provided a semiconductor memory device comprising: a memory cell array in which there are arranged a plurality of cell units having memory cells and selection gate transistor to select the memory cells; a first selection gate line which includes a first control gate of the selection gate transistors, the first selection gate line having a first gate electrode, a first inter-gate insulating film and a second gate electrode superimposed in this order, the first inter-gate insulating film having a first opening portion through which the first gate electrode and the second gate electrode come into contact with each other; a second selection gate line formed above the first selection gate line; and a first contact material which is formed on the first selection gate line and electrically connects the first selection gate line and the second selection gate line with each other, the first contact material being arranged on the first selection gate line on which the first opening portion is not arranged.

According to a second aspect of the present invention, there is provided a semiconductor memory device comprising: first and second blocks in which a plurality of cell units having a plurality of memory cells connected in series and selection gate transistors connected with both ends of each of the plurality of memory cells are arranged; a shunt region which is arranged between the first block and the second block and in which the memory cell is not formed; a first selection gate line as a first control gate of the selection gate transistor which is formed to extend in the first and second blocks and in the shunt region, the first selection gate line having a first gate electrode, a first inter-gate insulating film and a second gate electrode superimposed in this order, the first inter-gate insulating film having a first opening portion through which the first gate electrode and the second gate electrode come into contact with each other; a second selection gate line formed above the first selection gate line; and a first contact material which is formed on the first selection gate line in the shunt region and electrically connects the first selection gate line and the second selection gate line with each other, wherein the first opening portion is arranged on the first selection gate line in the shunt region, and the first contact material is arranged on the first selection gate line on which the first opening portion is not arranged in the shunt region.

According to a third aspect of the present invention, there is provided a semiconductor memory device comprising: first and second blocks each including a plurality of activation regions, a plurality of memory cells and selection gate transistors, the plurality of activation regions extending in a column direction being arranged in a row direction, the plurality of memory cells connected in series being formed in each of the activation regions, and the selection gate transistors being formed at both ends of the plurality of memory cells connected in series; a shunt region which is arranged between the first block and the second block and in which first and second activation regions extending in the column direction are arranged in the row direction; a first selection gate line as a control gate of the selection gate transistors which is formed on the activation regions in the first and the second blocks and on the first and second activation regions in the shunt region to extend in the row direction, the first selection gate line having a first gate electrode, a first inter-gate insulating film and a second gate electrode superimposed in this order, the first inter-gate insulating film having a first opening portion through which the first gate electrode and the second gate electrode come into contact with each other; a second selection gate line which is formed above the first selection gate line; and a first contact material which is formed on the first selection gate line in the shunt region, and electrically connects the first selection gate line and the second selection gate line with each other, wherein, in the shunt region, the first opening portion is arranged on the first selection gate line on the first activation region, and the first contact material is arranged on the first selection gate line on the second activation region.

According to a fourth aspect of the present invention, there is provided a semiconductor device comprising: a source region formed on a semiconductor substrate; a drain region formed on the semiconductor substrate apart from the source region; a gate insulating film formed on a channel region between the source region and the drain region; a first gate electrode formed on the gate insulating film; an inter-gate insulating film which is formed on the first gate electrode, and has an opening portion immediately above the channel region; a second gate electrode formed on the first gate electrode in the opening portion and on the inter-gate insulating film; and a contact material formed on the second gate electrode immediately above the channel region, wherein the opening portion and the contact material do not overlap each other in a direction vertical to a surface of the semiconductor substrate.

DETAILED DESCRIPTION OF THE INVENTION

Figure 1:
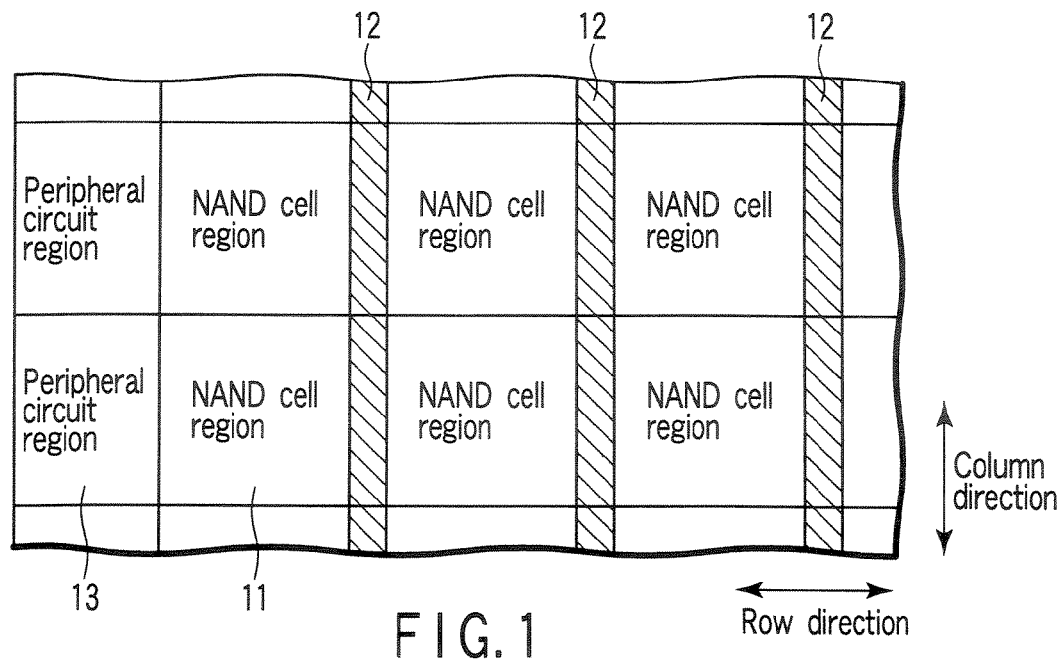
FIG. 1 is a layout chart showing an outline of a configuration of a semiconductor memory device according to an embodiment of the present invention.

A semiconductor memory device according to an embodiment of the present invention will now be described hereinafter with reference to the accompanying drawings. For explanation, like reference numerals denote like parts throughout the drawings.

FIG. 1 is a layout chart showing an outline of a configuration of a semiconductor memory device according to an embodiment of the present invention.

NAND cell regions 11 are arranged in a matrix shape form a row direction and a column direction, and each shunt region 12 is arranged between the NAND cell regions 11 in the row direction. A plurality of cell units each consisting of an NAND cell and selection gate transistors connected with both ends of the NAND cell are arranged in each NAND cell region 11. The NAND cell is formed of a memory cell group in which a plurality of memory cells are connected in series in such a manner that the memory cell having a control gate and a flowing gate superimposed and an adjacent memory cell share a source or a drain. An upper wiring line which reduces a resistance of a selection gate of the selection gate transistor is formed in the NAND cell region 11 and the shunt region 12, and a contact material which connects the selection gate of the selection gate transistor with the upper wiring line is formed in the shunt region 12. Further, an input/output circuit which inputs/outputs data with respect to each cell unit or a peripheral circuit including a drive circuit or the like which operates each cell unit is formed in each peripheral circuit region 13.

Figure 3:
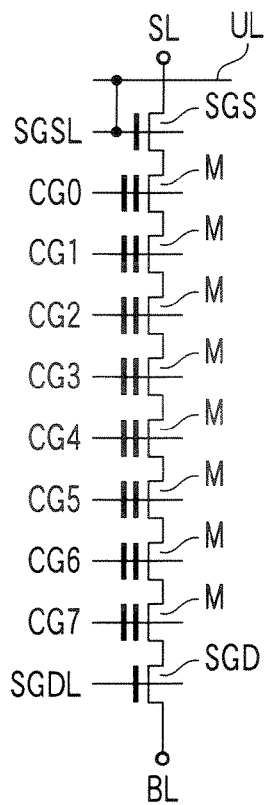
FIG. 3 is a circuit diagram of the cell unit according to the embodiment of the present invention.
Figure 2:
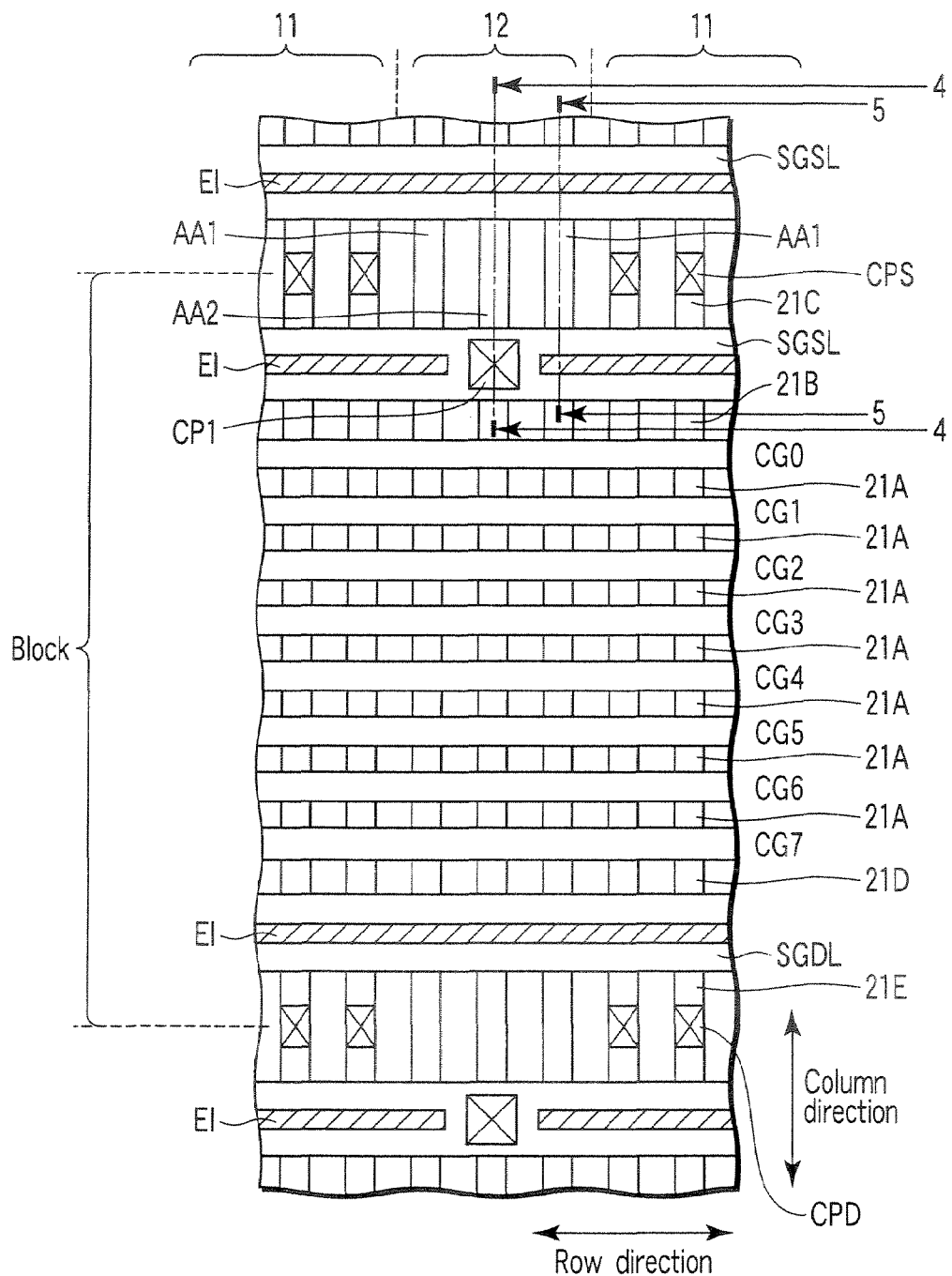
FIG. 2 is a layout chart showing a configuration of cell units in NAND cell regions according to the embodiment of the present invention.

FIG. 2 is an enlarged view showing a part of the shunt region 12 and the NAND cell regions 11 depicted in FIG. 1, and is a layout chart showing a configuration of the cell unit. FIG. 3 is a circuit diagram of the cell unit.

As shown in FIG. 2, control gates CG0 to CG7 of memory cells M0 to M7 are arranged in parallel with diffusion layers (sources or drains) 21A therebetween. A selection gate SGSL of a selection gate transistor SGS is arranged in the immediate vicinity of the control gate CGG with a diffusion layer (a source or a drain) 21B therebetween. A source contact CPS which connects the other diffusion layer (a source or a drain) 21C of the selection gate transistor SGS with a source line SL is formed on the diffusion layer 21C.

A selection gate SGDL of a selection gate transistor SGD is arranged in the immediate vicinity of the control gate CG7 with a diffusion layer (a source or a drain) 21D therebetween. A drain contact CPD which connects the other diffusion layer (a source or a drain) 21E of the selection gate transistor SGD with a bit line BL is formed on the diffusion layer 21E. Furthermore, an EI pattern is formed on the selection gates SGSL and SGDL in the NAND cell region 11. The EI pattern will be described later in detail.

Moreover, activation regions AA1 and AA2 and selection gates are formed in the shunt region 12 with the same periodic pattern as that of the diffusion layers 21A, 21B, 21C, 21D and 21E and the selection gates in the NAND cell region 11. However, although the EI pattern is formed on the selection gates GSL on the activation region AA1 in the shunt region 12, the EI pattern is not formed on the selection gate SGSL on the activation region AA2. A contact material CP1 which electrically connects the selection gate SGSL with an upper wiring line UL is formed on the selection gate SGSL on the activation region AA2. That is, the EI pattern is arranged on a part of the selection gate SGSL in the shunt region 12, and the contact material CP1 is arranged on the selection gate SGSL having no EI pattern arranged thereon in the shunt region 12.

Figure 4:
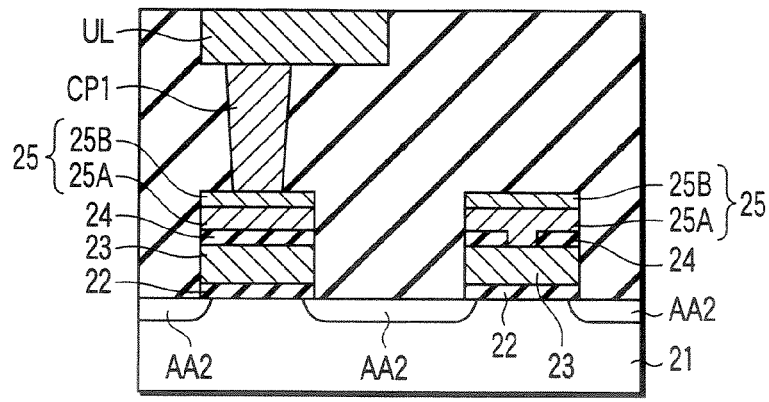
FIG. 4 is a cross-sectional view taken along a line 4-4 in the layout chart of FIG. 2.

FIG. 4 is a cross-sectional view taken along a line 4-4 in FIG. 2, and shows a cross-sectional structure on the activation region AA2 in the shunt region.

The selection gate SGSL having the contact material CP1 formed thereon has the following configuration. A gate insulating film 22 is formed on the activation region AA2 of a semiconductor substrate 21, and a selection gate SGSL having a first gate electrode 23, an inter-gate insulating film 24 and a second gate electrode 25 superimposed in this order is formed on this gate insulating film 22. The first gate electrode 23 is formed of a polysilicon film. The second gate electrode 25 is formed of a polysilicon film 25A formed on the inter-gate insulating film 24, and a silicide film 25B formed on this polysilicon film 25A. The silicide film 25B includes at least one of a tungsten silicide film, a cobalt silicide film, a titanium silicide film and a nickel silicide film. It is to be noted that the first gate electrode 23 corresponds to a floating gate electrode of the memory cell, and the second gate electrode 25 corresponds to a control gate electrode of the memory cell. Additionally, the contact material CP1 is formed on the second gate electrode 25, and the upper wiring line UL is formed on the contact material CP1. As a result, the selection gate SGSL is electrically connected with the upper wiring line UL through the contact material CP1. The contact material CP1 includes one of polysilicon, tungsten and titanium, or includes an alloy formed of at least two of polysilicon, tungsten and titanium.

Further, the other selection gate SGSL having no contact material CP1 formed thereon has the following configuration. The gate insulating film 22 is formed on the activation region AA2 of the semiconductor substrate 21, and the selection gate SGSL having the first gate electrode 23, the inter-gate insulating film 24 and the second gate electrode 25 superimposed in this order is formed on this gate insulating film 22. The inter-gate insulating film 24 is removed in the vicinity of a central part, and the polysilicon film 25A enters the removed region (an opening portion) so that the first gate electrode 23 and the second gate electrode 25 are electrically connected with each other. A pattern in which the inter-gate insulating film 24 is removed and the polysilicon film 25A enters the removed region in this manner is referred to as an EI (Etching Interpoly) pattern.

Figure 5:
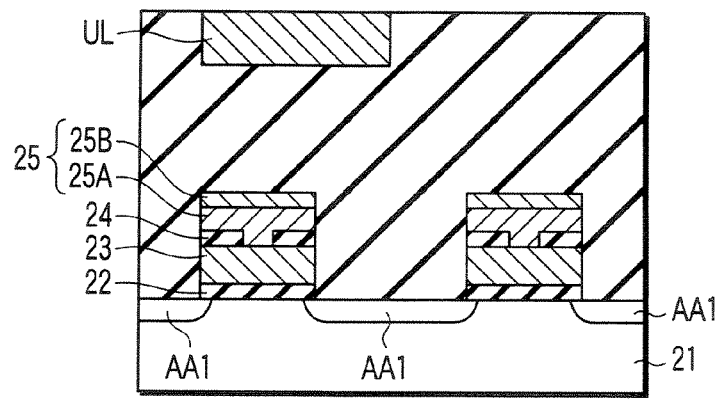
FIG. 5 is a cross-sectional view taken along a line 5-5 in the layout chart of FIG. 2.

FIG. 5 is a cross-sectional view taken along a line 5-5 in FIG. 2, and shows a cross-sectional configuration on the activation region AA1 in the shunt region. The contact material is not formed on the selection gate SGSL on the activation region AA1, and the EI pattern is formed on the selection gate SGSL.

The cross-sectional configuration is as follows. The gate insulating film 22 is formed on the activation region AA1 of the semiconductor substrate 21, and the selection gate SGSL having the first gate electrode 23, the inter-gate insulating film 24 and the second gate electrode 25 superimposed in this order is formed on this gate insulating film 22. The second gate electrode 25 is formed of the polysilicon film 25A formed on the inter-gate insulating film 24, and the silicide film 25B formed on this polysilicon film 25A. The EI pattern is formed on the inter-gate insulating film 24, and the first gate electrode 23 and the second gate electrode 25 are electrically connected with each other. Furthermore, the upper wiring line UL is formed in an upper layer of the selection gate SGSL.

In the semiconductor memory device having the configuration shown in FIG. 2, since the inter-gate insulating film 24 exists below the second gate electrode 25 having the contact material CP1 formed thereon in the selection gate SGSL in the shunt region 12, in other words, since the EI pattern is not formed below the second gate electrode 25 having the contact material CP1 formed thereon, it is possible to prevent the gate insulating film 22 below the first gate electrode 23 from being destroyed due to a mechanical stress or a stress caused by formation of the contact material. As a result, an inconvenience such as instability of insulating properties of the selection gate SGSL and the semiconductor substrate can be avoided, and noise generated in a selection gate potential can be reduced, thereby stabilizing the selection gate potential.

A peripheral circuit formed in the peripheral circuit region 13 depicted in FIG. 1 will now be described.

Usually, the same steps as manufacturing steps of the unit cell are utilized to form a peripheral circuit in the peripheral circuit region 13 formed on the same semiconductor substrate as that of the above-described NAND cell region 11. Therefore, a peripheral transistor constituting the peripheral circuit has a multilayer gate having a first gate electrode, an inter-gate insulating film and a second gate electrode superimposed on a gate insulating film and has a configuration in which the first gate electrode and the second gate electrode are connected with each other through the EI pattern like the above-mentioned selection gate transistor.

Figure 6:
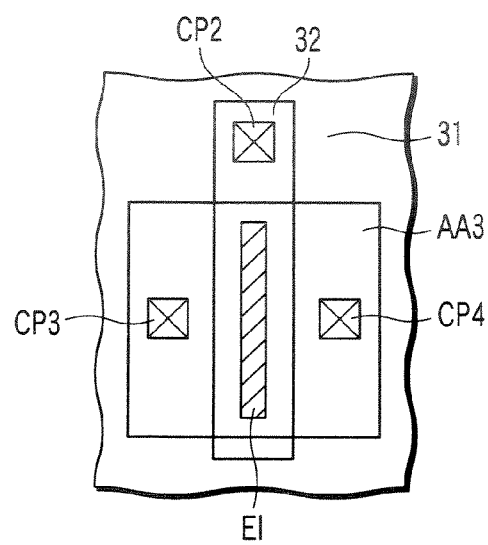
FIG. 6 is a layout chart showing a configuration of a peripheral transistor included in a conventional peripheral circuit.

FIG. 6 shows a layout of a conventional peripheral transistor. A gate electrode 32 is formed on an activation region AA3 and an element isolation region 31. The EI pattern is formed on the gate electrode 32 on the activation region AA3, and a contact material CP2 which connects this gate electrode 32 with an upper wiring line (not shown) is formed on the gate electrode 32 on the element isolation region 31. Furthermore, contact materials CP3 and CP4 which connect a source region and a drain region of the activation region AA3 with the upper wiring line (not shown) are respectively formed on these regions. In the peripheral transistor having such a configuration, a gate electrode region based on a predetermined rule is required on the element isolation region 31 in order to form the contact material CP2. Therefore, an area required for formation of the peripheral transistor cannot be reduced.

Figure 7:
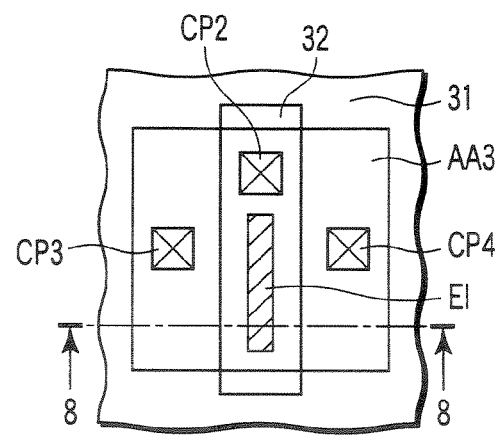
FIG. 7 is a layout chart showing a first structural example of a peripheral transistor in a peripheral circuit region according to the embodiment of the present invention.
Figure 9:
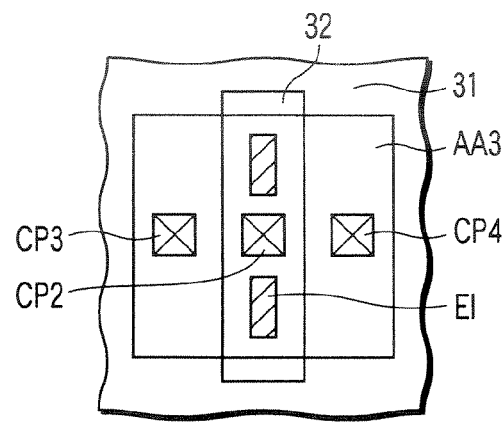
FIG. 9 is a layout chart showing a second structural example of a peripheral transistor in a peripheral circuit region according to the embodiment of the present invention.

FIGS. 7 and 9 show structural examples of the peripheral transistor according to this embodiment. In the embodiment, the EI pattern is formed on a gate electrode 32 on an element isolation region AA3, and the contact material CP2 is formed on the gate electrode 32 having no EI pattern on the element isolation region AA3.

Figure 8:
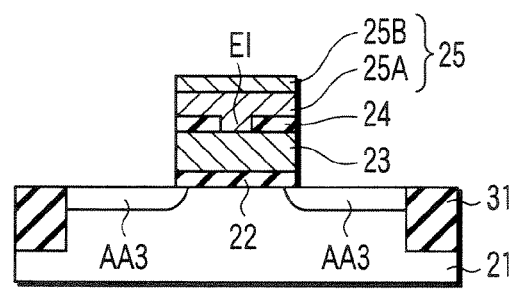
FIG. 8 is a cross-sectional view taken along a line 8-8 in the layout chart of FIG. 7.

In detail, in the peripheral transistor depicted in FIG. 7, the EI pattern is formed in a first region and the contact material CP2 is formed in a second region where the EI pattern is not formed in the gate electrode 32 on a channel region of the element region AA3. FIG. 8 shows a cross section taken along a line 8-8 in FIG. 7. A gate insulating film 22 is formed on an activation region AA1 isolated by an element isolation region 31 of a semiconductor substrate 21. The gate electrode 32 having a first gate electrode 23, an inter-gate insulating film 24 and a second gate electrode 25 superimposed in this order is formed on this gate insulating film 22. The first gate electrode 23 is formed of a polysilicon film. The second gate electrode 25 is formed of a polysilicon film 25A formed on the inter-gate insulating film 24, and a silicide film 25B formed on this polysilicon film 25A. Furthermore, the EI pattern is formed on the inter-gate insulating film 24, and the first gate electrode 23 and the second gate electrode 25 are electrically connected with each other.

In the peripheral transistor depicted in FIG. 9, the EI patterns are formed on both end sides of the gate electrode on the channel region of the element region AA3, and the contact material CP2 is formed on the gate electrode 32 having no EI pattern sandwiched between these EI patterns. The contact material CP2 contains one of polysilicon, tungsten and titanium, or contains an alloy formed of at least two of polysilicon, tungsten and titanium.

According to the peripheral transistor having such a configuration, the contact material which connects the gate electrode with the upper wiring line is not formed on the gate electrode on the element isolation region, but formed on the gate electrode on which the EI pattern is not arranged on the channel region in the activation region. As a result, an area required for formation of the peripheral transistor can be reduced as compared with a prior art while maintaining stability of a gate potential Consequently, an area required for formation of a peripheral circuit including the peripheral transistor can be decreased, thereby facilitating miniaturization and an increase in capacity of the semiconductor memory device and the semiconductor device.

According to the embodiment of the present invention, it is possible to provide the semiconductor memory device which can reduce noise of a selection gate potential in the selection gate transistor and increase stability. Further, according to the embodiment of the present invention, it is possible to provide the semiconductor device which can reduce an area required for formation of the transistor and decrease an area of a circuit region including the transistor.

It is to be noted that the foregoing embodiment is not an only embodiment, and various modifications can be formed by changing the above-described configuration or adding various kinds of configurations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor memory device comprising:
   first and second blocks in which a plurality of cell units having a plurality of memory cells connected in series and selection gate transistors connected with both ends of each of the plurality of memory cells are arranged;
   a shunt region which is arranged between the first block and the second block and in which the memory cell is not formed, and which contains a first activation region formed in the shunt region to extend in a first direction;
   a first selection gate line as a first control gate of the selection gate transistor which is formed to extend in the first and second blocks and in the shunt region in a second direction perpendicular to the first direction, the first selection gate line having a first gate electrode, a first inter-gate insulating film formed on the first gate electrode and a second gate electrode formed on the first inter-gate insulating film, the first inter-gate insulating film having a first opening portion contacting the first gate electrode with the second gate electrode;
   a second selection gate line formed above the first selection gate line; and
   a first contact material which is formed on the first selection gate line in the shunt region and electrically connects the first selection gate line and the second selection gate line with each other,
   wherein:
   the shunt region contains an intersection region at which the first activation region and the first selection gate line intersect each other;
   the intersection region is provided without containing the first opening portion, and in the intersection region, the first inter-gate insulating film isolates the first gate electrode and the second gate electrode in the first selection gate line from each other; and
   in the intersection region, the first contact material is located on a line which extends from the first opening portion in the first selection gate line in a longitudinal direction of the first opening portion.

2. The semiconductor memory device according to claim 1, wherein a second activation region is formed to extend in the first direction in the shunt region, and in a region at which the second activation region and the first selection gate line intersect each other, the first opening portion is present.

3. The semiconductor memory device according to claim 1, wherein the memory cell includes a first gate insulating film on a semiconductor substrate, a floating gate on the first gate insulating film, a second inter-gate insulating film on the floating gate, and a second control gate on the second inter-gate insulating film.

4. The semiconductor memory device according to claim 3, further comprising:
   a source region formed on the semiconductor substrate;
   a drain region formed on the semiconductor substrate apart from the source region;
   a second gate insulating film formed on the semiconductor substrate between the source region and the drain region;
   a third gate electrode formed on the second gate insulating film;
   a third inter-gate insulating film which is formed on the third gate electrode, and has a second opening portion immediately above the semiconductor substrate between the source region and the drain region;
   a fourth gate electrode formed on the third gate electrode in the second opening portion and on the third inter-gate insulating film; and
   a second contact material formed on the fourth gate electrode immediately above the semiconductor substrate between the source region and the drain region,
   wherein the second opening portion and the second contact material do not overlap each other in a direction vertical to a surface of the semiconductor substrate.

5. The semiconductor memory device according to claim 1, wherein the selection gate transistor connected with one end of each of the plurality of memory cells is connected with a source line, and the selection gate transistor connected with the other end of each of the plurality of memory cells is connected with a bit line.

6. The semiconductor memory device according to claim 1, wherein the plurality of memory cells are arranged in such a manner that the memory cells adjacent to each other share a source or a drain.

7. The semiconductor memory device according to claim 1, wherein the second gate electrode includes a polysilicon film and a silicide film formed on the polysilicon film.

* * * * *